(12) United States Patent
Mei

(10) Patent No.: US 12,484,370 B2
(45) Date of Patent: Nov. 25, 2025

(54) LIGHT EMITTING DEVICE AND METHOD FOR PREPARING THE SAME, DISPLAY PANEL AND DISPLAY DEVICE

(71) Applicants: Beijing BOE Technology Development Co., Ltd., Beijing (CN); BOE Technology Group Co., Ltd., Beijing (CN)

(72) Inventor: Wenhai Mei, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/794,335

(22) PCT Filed: Aug. 27, 2021

(86) PCT No.: PCT/CN2021/115158
§ 371 (c)(1),
(2) Date: Jul. 21, 2022

(87) PCT Pub. No.: WO2023/024118
PCT Pub. Date: Mar. 2, 2023

(65) Prior Publication Data
US 2024/0206210 A1 Jun. 20, 2024

(51) Int. Cl.
*H10K 50/115* (2023.01)
*C09K 11/06* (2006.01)
(Continued)

(52) U.S. Cl.
CPC ............ *H10K 50/115* (2023.02); *C09K 11/06* (2013.01); *H10K 71/60* (2023.02); *H10K 85/111* (2023.02)

(58) Field of Classification Search
CPC ...... H10K 50/115; H10K 50/11; H10K 50/16; H10K 50/15; H10K 50/157; H10K 50/167;
(Continued)

(56) References Cited

U.S. PATENT DOCUMENTS 5,677,545 A * 10/1997 Shi .................... B82Y 30/00
313/506
5,751,018 A * 5/1998 Alivisatos ......... H01L 21/02557
257/E21.13
(Continued)

FOREIGN PATENT DOCUMENTS

| CN | 108550707 A | 9/2018 |
| CN | 111029474 A | 4/2020 |

(Continued)

OTHER PUBLICATIONS

CN 202180002314.3 first office action dated Jun. 4, 2025.

*Primary Examiner* — Sophia T Nguyen
(74) *Attorney, Agent, or Firm* — IPro, PLLC

(57) ABSTRACT

The present disclosure provides a light emitting device and a method for preparing the same, a display panel and a display device. The light emitting device includes: a base substrate; a first electrode, a light emitting layer and a second electrode stacked on the base substrate in sequence; the light emitting layer includes a polymer alignment layer and a quantum dot layer arranged adjacently, the polymer alignment layer having main chains, at least parts of which have a same length direction in the polymer alignment layer, and a ligand group connected to quantum dots in the quantum dot layer through a coordination bond.

20 Claims, 5 Drawing Sheets

(51) Int. Cl.
*H10K 71/60* (2023.01)
*H10K 85/10* (2023.01)

(58) Field of Classification Search
CPC ........ H10K 71/00; H10K 71/10; H10K 71/12; H10K 71/191; H10K 71/15; H10K 85/111; H10K 85/10; H10K 85/113; H10K 85/1135; H10K 85/114; H10K 85/115; H10K 85/151; C09K 11/06; C09K 11/07; C09K 11/00
See application file for complete search history.

(56) References Cited

U.S. PATENT DOCUMENTS

| | | | | |
|---|---|---|---|---|
| 7,776,758 | B2 * | 8/2010 | Duan | H01L 21/28229 438/758 |
| 10,439,155 | B2 * | 10/2019 | Park | H10K 50/171 |
| 10,976,613 | B1 * | 4/2021 | Cheng | G02F 1/133788 |
| 11,367,859 | B2 * | 6/2022 | Hamilton | H10K 85/50 |
| 11,626,534 | B2 * | 4/2023 | Boardman | H10H 20/812 257/13 |
| 2005/0219449 | A1 * | 10/2005 | Tanaka | G02B 5/3083 349/119 |
| 2006/0040103 | A1 * | 2/2006 | Whiteford | B82Y 30/00 428/403 |
| 2007/0032091 | A1 * | 2/2007 | Heald | H10D 64/035 438/758 |
| 2007/0215856 | A1 * | 9/2007 | Kwon | H10K 50/11 257/14 |
| 2009/0275782 | A1 * | 11/2009 | Emrick | B82Y 10/00 977/774 |
| 2010/0009069 | A1 * | 1/2010 | Nam | G02F 1/133711 427/67 |
| 2014/0371365 | A1 * | 12/2014 | Bae | C08G 73/1039 524/398 |
| 2015/0072092 | A1 * | 3/2015 | Seo | C09K 11/565 428/484.1 |
| 2015/0129838 | A1 * | 5/2015 | Lewis | H10F 77/1433 438/94 |
| 2016/0233449 | A1 * | 8/2016 | Murayama | C09K 11/565 |
| 2017/0155051 | A1 * | 6/2017 | Torres Cano | C09K 11/02 |
| 2017/0166676 | A1 * | 6/2017 | Viswanath | C08F 292/00 |
| 2017/0352827 | A1 * | 12/2017 | Cho | C09K 11/883 |
| 2018/0011364 | A1 * | 1/2018 | Deng | H05B 33/28 |
| 2018/0019371 | A1 * | 1/2018 | Steckel | C09K 11/883 |
| 2018/0033988 | A1 * | 2/2018 | Walter | H10K 85/141 |
| 2018/0053907 | A1 | 2/2018 | He et al. | |
| 2018/0108841 | A1 * | 4/2018 | Li | H10K 71/162 |
| 2018/0171219 | A1 * | 6/2018 | Xie | C09K 11/02 |
| 2018/0254421 | A1 * | 9/2018 | Kinge | H10K 50/115 |
| 2018/0314106 | A1 * | 11/2018 | Yang | G02F 1/133512 |
| 2018/0331312 | A1 | 11/2018 | Pan et al. | |
| 2019/0081263 | A1 * | 3/2019 | Park | H10K 50/115 |
| 2019/0086732 | A1 * | 3/2019 | Wang | G02F 1/13439 |
| 2019/0131587 | A1 * | 5/2019 | Chen | H10K 50/13 |
| 2019/0267510 | A1 * | 8/2019 | Chen | C08F 292/00 |
| 2019/0276733 | A1 * | 9/2019 | Mei | B01J 19/0013 |
| 2019/0305240 | A1 | 10/2019 | Angioni et al. | |
| 2019/0305241 | A1 * | 10/2019 | Angioni | H10K 50/15 |
| 2020/0235326 | A1 * | 7/2020 | Rahmati | H10K 50/15 |
| 2020/0355664 | A1 * | 11/2020 | Hegmann | G01N 33/0047 |
| 2020/0411785 | A1 * | 12/2020 | Kanehiro | H05B 33/10 |
| 2020/0411786 | A1 * | 12/2020 | Boardman | H10K 59/873 |
| 2021/0028384 | A1 * | 1/2021 | Liang | C09K 11/02 |
| 2021/0066631 | A1 * | 3/2021 | Choi | H10K 71/12 |
| 2021/0253948 | A1 * | 8/2021 | Zhang | C09K 11/06 |
| 2021/0328165 | A1 * | 10/2021 | Zampetti | H10K 50/15 |
| 2021/0371743 | A1 * | 12/2021 | Liang | H10K 71/40 |
| 2022/0077238 | A1 * | 3/2022 | Takata | H10K 85/30 |
| 2022/0082749 | A1 * | 3/2022 | Malhotra | G02B 5/3041 |
| 2022/0115613 | A1 * | 4/2022 | Ueta | H10K 50/115 |
| 2022/0127527 | A1 * | 4/2022 | Zhang | C01B 19/04 |
| 2022/0195289 | A1 * | 6/2022 | Ha | H10K 59/38 |
| 2022/0263039 | A1 * | 8/2022 | Angioni | H10K 50/15 |
| 2022/0310953 | A1 * | 9/2022 | Li | C09K 11/025 |
| 2022/0320453 | A1 * | 10/2022 | Wang | H10K 50/15 |
| 2022/0359845 | A1 * | 11/2022 | Kobashi | H10K 50/11 |
| 2022/0367830 | A1 * | 11/2022 | Jung | H10K 50/15 |
| 2022/0376196 | A1 * | 11/2022 | Minotto | H10K 59/30 |
| 2022/0376197 | A1 * | 11/2022 | Zhang | H10K 71/00 |
| 2022/0416186 | A1 * | 12/2022 | Takenaka | H10K 50/13 |
| 2023/0232648 | A1 * | 7/2023 | Li | H10K 50/125 257/13 |
| 2023/0403922 | A1 * | 12/2023 | Wang | H10K 50/115 |
| 2024/0224560 | A1 * | 7/2024 | Wang | H10K 71/00 |
| 2024/0276868 | A1 * | 8/2024 | Jo | H10K 71/135 |
| 2024/0292643 | A1 * | 8/2024 | Wang | H10K 50/115 |
| 2024/0306412 | A1 * | 9/2024 | Li | H10K 71/421 |
| 2024/0307867 | A1 * | 9/2024 | Habarakada Liyanage | G01N 33/54353 |
| 2024/0373660 | A1 * | 11/2024 | Ueta | H10K 50/181 |

FOREIGN PATENT DOCUMENTS

| | | |
|---|---|---|
| CN | 111548785 A | 8/2020 |
| CN | 112750954 A | 5/2021 |
| KR | 20210080923 A | 7/2021 |

* cited by examiner

LIGHT EMITTING DEVICE AND METHOD FOR PREPARING THE SAME, DISPLAY PANEL AND DISPLAY DEVICE

CROSS-REFERENCE TO RELATED APPLICATION

This application is the U.S. national phase of PCT Application No. PCT/CN2021/115158 filed on Aug. 27, 2021, the disclosures of which are incorporated in their entirety by reference herein

TECHNICAL FIELD

The present disclosure relates to the field of display technology, in particular, to a light emitting device and a method for preparing the same, a display panel and a display device.

BACKGROUND

With the increasing demand of consumers, high-resolution products have become the key development direction of display products. With the development of quantum dot technology, the research on electro-quantum dot light emitting diodes has been deepened, the quantum efficiency has been continuously improved, and it has basically reached the level of industrialization. It has become a future trend to further use new processes and technologies to realize its industrialization. The efficiency of QLED devices has reached a high level, but with the improvement of product requirements, the performance of existing quantum dot light emitting devices is difficult to meet the needs.

SUMMARY

A purpose of the embodiments of the present application is to provide a light emitting device and a method for preparing the same, a display panel and a display device.

In a first aspect, an embodiment of the present disclosure provides a light emitting device, including: a base substrate; and a first electrode, a light emitting layer and a second electrode stacked on the base substrate in sequence, in which the light emitting layer includes a polymer alignment layer and a quantum dot layer arranged adjacently, and the polymer alignment layer has main chains, at least parts of which have a same length direction in the polymer alignment layer, and a ligand group connected to quantum dots in the quantum dot layer through a coordination bond.

Optionally, the polymer alignment layer includes: a first polymer alignment layer arranged between the quantum dot layer and the first electrode, the main chains of the first polymer alignment layer having a first group, and a surface of the first electrode proximate to the first polymer alignment layer having a second group connected to the first group through a chemical bond; and/or a second polymer alignment layer arranged between the quantum dot layer and the second electrode, the main chains of the second polymer alignment layer having a first group, and a surface of the second electrode proximate to the second polymer alignment layer having a second group connected to the first group through a chemical bond.

Optionally, the polymer alignment layer includes: the first polymer alignment layer arranged between the quantum dot layer and the first electrode; and a first carrier transport layer arranged between the first polymer alignment layer and the first electrode, the main chains of the first polymer alignment layer having a first group, and a surface of the first carrier transport layer proximate to the first polymer alignment layer having a second group connected to the first group through a chemical bond.

Optionally, the polymer alignment layer includes: the second polymer alignment layer arranged between the quantum dot layer and the second electrode; and a second carrier transport layer arranged between the second polymer alignment layer and the second electrode, the main chains of the second polymer alignment layer having a first group, and a surface of the second carrier transport layer proximate to the second polymer alignment layer having a second group connected to the first group through a chemical bond.

Optionally, the quantum dot layer has a plurality of layers, and the polymer alignment layer includes a third polymer alignment layer arranged between adjacent quantum dot layers.

Optionally, the polymer alignment layer has a plurality of layers, and the quantum dot layer is arranged between adjacent polymer alignment layers.

Optionally, at least 70% of the main chains in the polymer alignment layer have a same length direction.

Optionally, the polymer alignment layer has a plurality of repeating units, and the main chain in each of the repeating units is connected to one ligand group.

Optionally, the main chains of the polymer alignment layer have a polar group.

Optionally, the polar group includes: at least one selected from a group consisting of hydroxyl, carboxyl, amino, amide, sulfonyl, sulfonic acid, sulfonamide, aliphatic amine, alicyclic amine, aromatic amine and nitrogen-containing group of N-containing aromatic heterocycle.

Optionally, the polymer alignment layer includes at least one of:

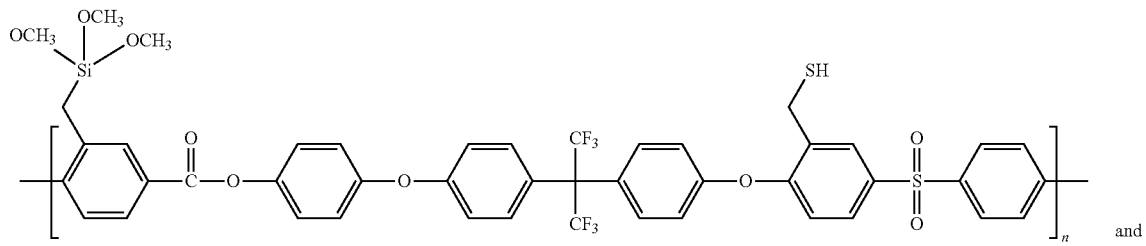

and

-continued

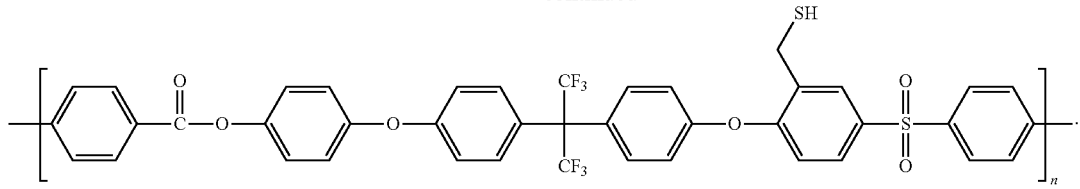

Optionally, the polymer alignment layer includes at least one selected from a group consisting of polyimide, polyethersulfone, polyphenylene ether and polyetheretherketone.

In a second aspect, an embodiment of the present disclosure provides a method for preparing a display substrate, including: forming a first electrode on a base substrate; forming a light emitting layer on the first electrode; and forming a second electrode on the light emitting layer.

Optionally, the light emitting layer includes a polymer alignment layer and a quantum dot layer arranged adjacently, the polymer alignment layer having main chains, at least parts of which have a same length direction in the polymer alignment layer, and a ligand group connected to quantum dots in the quantum dot layer through a coordination bond.

Optionally, the forming the light emitting layer on the first electrode includes: coating a polymer material on the first electrode and forming the polymer alignment layer by irradiating the polymer material with light; and forming the quantum dot layer and another polymer alignment layer on the polymer alignment layer in sequence; and the forming the quantum dot layer and another polymer alignment layer on the polymer alignment layer in sequence includes: forming a quantum dot layer on the polymer alignment layer; coating a polymer material on the quantum dot layer and forming another polymer alignment layer by irradiating the polymer material with light; and repeating the forming the quantum dot layer and another polymer alignment layer on the polymer alignment layer in sequence one or more times.

Optionally, during the forming the quantum dot layer and another polymer alignment layer on the polymer alignment layer in sequence, an initial ligand in the quantum dot layer is ligand-exchanged with the ligand group in the polymer alignment layer, such that the ligand groups in the polymer alignment layer and the quantum dots in the quantum dot layer are connected through a coordinate bond.

In a third aspect, an embodiment of the present disclosure provides a display panel including the light emitting device described in the above embodiments.

In a fourth aspect, an embodiment of the present disclosure provides a display device including the display substrate described in the above embodiments.

Figure 1:
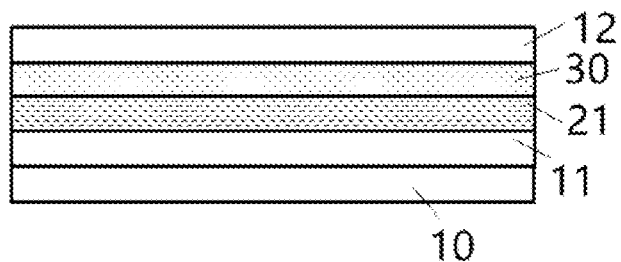
FIG. 1 is a schematic view showing a light emitting device according to one embodiment.

REFERENCE NUMBERS base substrate 10; first electrode 11; second electrode 12; polymer alignment layer 20; first polymer alignment layer 21; second polymer alignment layer 22; third polymer alignment layer 23; quantum dot layer 30; first carrier transport layer 41; second carrier transport layer 42; hole injection layer 411; hole transport layer 412; electron injection layer 421; electron transport layer 422.

DETAILED DESCRIPTION

The technical solutions in the embodiments of the present disclosure will be described hereinafter in conjunction with the drawings in a clear and complete manner. Obviously, the following embodiments relate to a part of, rather than all of, the embodiments of the present disclosure. Based on these embodiments, a person skilled in the art may, without any creative effort, obtain the other embodiments, which also fall within the scope of the present disclosure.

The terms "first", "second", etc. in the description and claims of the present disclosure are used to distinguish similar objects, and are not used to describe a specific order or sequence. It is to be understood that data so used may be interchanged under appropriate circumstances so that embodiments of the present disclosure can be practiced in sequences other than those illustrated or described herein. In addition, "and/or" in the description and claims indicates at least one of the connected objects, and the character "/" generally indicates that the associated objects are in an "or" relationship.

The light emitting device provided by the embodiments of the present disclosure will be described in detail below with reference to FIGS. 1 to 10, through specific embodiments and application scenarios thereof.

As shown in FIG. 1 to FIG. 9, the light emitting device according to the embodiment of the present disclosure includes: a base substrate 10; a first electrode 11, a light emitting layer and a second electrode 12 stacked on the base substrate 10 in sequence; the first electrode 11 can be an anode and the second electrode 12 can be a cathode, or the first electrode 11 can be a cathode and the second electrode 12 can be an anode. The light emitting layer includes a polymer alignment layer 20 and a quantum dot layer 30 arranged adjacently. When both the polymer alignment layer 20 and the quantum dot layer 30 may have one layer, the polymer alignment layer 20 and the quantum dot layer 30 are stacked. When both the polymer alignment layers 20 and the quantum dot layers 30 have a plurality of layers, the polymer alignment layers 20 and the quantum dot layers 30 may be stacked alternately. The polymer alignment layer 20 may have main chains, at least parts of which have a same length direction in the polymer alignment layer 20. It should be noted that as long as the included angle in the length direction of the two main chains is within 10 degrees, it is deemed as the same length direction. At least parts of the main chain in the polymer alignment layer 20 are in an ordered arrangement, it can enhance the tensile properties and bending properties of the film layer, increase the stability of the film layer, and further increase the stability of the quantum dot layer 30. The polymer alignment layer 20 has a ligand group, and the ligand group can include one or more selected from a group consisting of thiol, amino, carboxyl, and phosphoroxy. The ligand groups are connected to the quantum dots in the quantum dot layer 30 through a coordination bond, so that the quantum dot layer can be kept stable.

In the light emitting device of the embodiment of the present disclosure, the light emitting layer has a polymer alignment layer 20 and a quantum dot layer 30 arranged adjacently, at least parts of the main chains have a same length direction in the polymer alignment layer 20, and at least parts of the main chains in the polymer alignment layer 20 are in an ordered arrangement. It can enhance the tensile properties and bending properties of the film layer, increase the stability of the film layer, and further increase the stability of the quantum dot layer 30. The ligand groups in the polymer alignment layer 20 are connected to the quantum dots in the quantum dot layer 30 through a coordination bond, so that the quantum dot layer can be kept stable. By arranging the polymer alignment layer 20 and the quantum dot layer 30 in the light emitting layer, the mechanical properties and stability of the quantum dot layer 30 can be increased by the polymer alignment layer 20, the mechanical properties of the entire light emitting layer can be made more stable, the quantum dot layer can be prevented from being damaged or cracked during the stretching and bending process, and the stability of the light emitting performance can be ensured, to improve the performance of light emitting devices.

In some embodiments, as shown in FIG. 1, the polymer alignment layer 20 may include: a first polymer alignment layer 21 arranged between the quantum dot layer 30 and the first electrode 11, the main chains of the first polymer alignment layer may have a first group, and a surface of the first electrode 11 proximate to the first polymer alignment layer 21 may have a second group connected to the first group through a chemical bond. The chemical bond between the group and the second group can enhance the connection strength between the first electrode 11 and the first polymer alignment layer 21, so that the first polymer alignment layer 21 is more stable and can be prevented from being dissolved and destroyed by the quantum dot solution. The first group may include but not limited to trimethoxysilane, and the second group may include hydroxyl. For example, the first group is trimethoxysilane, and the second group is hydroxyl. The first polymer alignment layer 21 may have main chains, at least parts of which have a same length direction in the first polymer alignment layer 21. At least parts of the main chains in the first polymer alignment layer 21 are in an ordered arrangement, it can enhance the tensile properties and bending properties of the film layer, and increase the stability of the film layer. The first polymer alignment layer 21 has a ligand group. The ligand groups are connected to the quantum dots in the quantum dot layer 30 through a coordination bond, so that the quantum dot layer can be kept stable.

Figure 2:
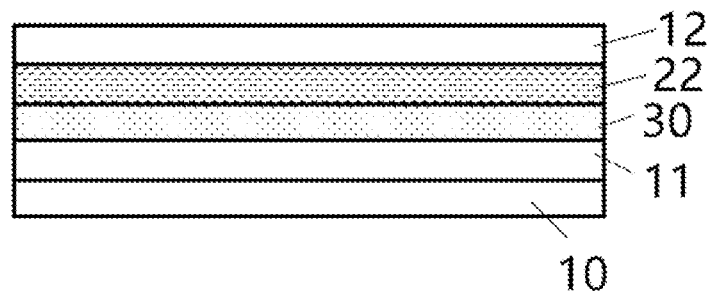
FIG. 2 is a schematic view showing a light emitting device according to another embodiment.

In other embodiments, as shown in FIG. 2, the polymer alignment layer 20 may include: a second polymer alignment layer 22 arranged between the quantum dot layer 30 and the second electrode 12, the main chains of the second polymer alignment layer 22 may have a first group, and a surface of the second electrode 12 proximate to the second polymer alignment layer 22 may have a second group connected to the first group through a chemical bond. The chemical bond between the group and the second group can enhance the connection strength between the second electrode 12 and the second polymer alignment layer 22, so that the second polymer alignment layer 22 is more stable and can be prevented from being dissolved and destroyed by the quantum dot solution. The first polymer alignment layer 21 and the second polymer alignment layer 22 may be the same, and may be formed of the same material. The second polymer alignment layer 22 may have main chains, at least parts of which have a same length direction in the second polymer alignment layer 22. At least parts of the main chains in the second polymer alignment layer 22 are in an ordered arrangement, it can enhance the tensile properties and bending properties of the film layer, and increase the stability of the film layer. The second polymer alignment layer 22 has a ligand group. The ligand groups are connected to the quantum dots in the quantum dot layer 30 through a coordination bond, so that the quantum dot layer can be kept stable.

Figure 5:
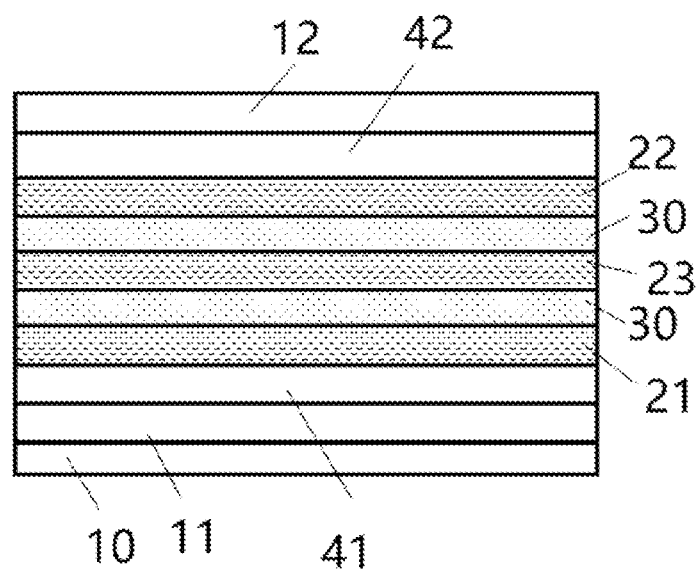
FIG. 5 is a schematic view showing a light emitting device according to one yet embodiment.
Figure 6:
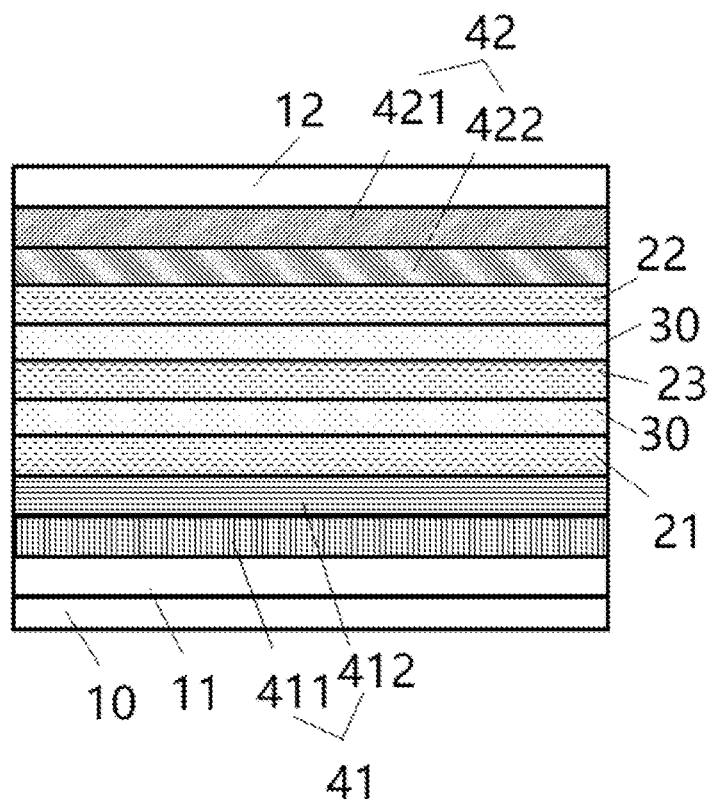
FIG. 6 is a schematic view showing a light emitting device according to one yet embodiment.
Figure 7:
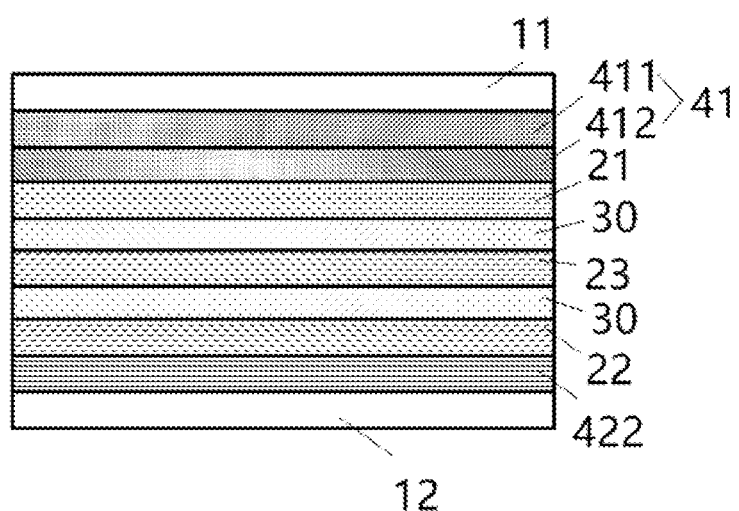
FIG. 7 is a schematic view showing a light emitting device according to one yet embodiment.

In the embodiment of the present disclosure, as shown in FIG. 5 to FIG. 7, the polymer alignment layer 20 may include: a first polymer alignment layer 21 arranged between the quantum dot layer 30 and the first electrode 11; a first carrier transport layer 41 arranged between the first polymer alignment layer 21 and the first electrode 11, the main chains of the first polymer alignment layer 21 has a first group, a surface of the first carrier transport layer 41 proximate to the first polymer alignment layer 21 may have a second group connected to the first group through a chemical bond. The chemical bond between the first group and the second group can enhance the connection strength between the first carrier transport layer 41 and the first polymer alignment layer 21, so that the first polymer alignment layer 21 is more stable and can be prevented from being dissolved and destroyed by the quantum dot solution. Optionally, when the first electrode 11 is an anode and the second electrode 12 is a cathode, the first carrier transport layer 41 may include one or both of a hole injection layer and a hole transport layer, for example, the first carrier transport layer 41 may be a hole transport layer. When the first carrier transport layer 41 includes a hole injection layer 411 and a hole transport layer 412, the hole injection layer 411 may be arranged proximate to the first electrode 11. The first electrode 11 may be a cathode, the second electrode 12 may be an anode, and the first carrier transport layer 41 may include one or both of an electron injection layer and an electron transport layer, for example, the first carrier transport layer 41 may be an electron transport layer. When the first carrier transport layer 41 includes an electron injection layer and an electron transport layer, the electron injection layer may be arranged proximate to the first electrode 11.

In some embodiments, as shown in FIGS. 5 to 7, the polymer alignment layer 20 may include: a second polymer alignment layer 22 arranged between the quantum dot layer 30 and the second electrode 12; a second carrier transport layer 42 arranged between the second polymer alignment layer 22 and the second electrode 12, the main chains of the second polymer alignment layer 22 has a first group, a surface of the second carrier transport layer 42 proximate to the second polymer alignment layer 22 may have a second group connected to the first group through a chemical bond. The chemical bond between the first group and the second group can enhance the connection strength between the second carrier transport layer 42 and the second polymer alignment layer 22, so that the second polymer alignment layer 22 is more stable and can be prevented from being dissolved and destroyed by the quantum dot solution. Optionally, when the first electrode 11 is a cathode and the second electrode 12 is an anode, the second carrier transport layer 42 may include one or both of a hole injection layer and a hole transport layer, for example, the second carrier transport layer 42 may be a hole transport layer. When the second carrier transport layer 42 includes a hole injection layer and a hole transport layer, the hole injection layer may be arranged proximate to the second electrode 12. The first electrode 11 may be an anode, such as ITO (indium tin oxide); the second electrode 12 may be a cathode, such as silver; and the second carrier transport layer 42 may include one or both of an electron injection layer and an electron transport layer, for example, the second carrier transport layer 42 may be the electron transport layer 422. When the second carrier transport layer 42 includes the electron injection layer 421 and the electron transport layer 422, the electron injection layer 421 may be arranged proximate to the second electrodes 12.

In an embodiment of the present disclosure, as shown in FIG. 5, the quantum dot layer 30 may have a plurality of layers, and the polymer alignment layer 20 may include a third polymer alignment layer 23 arranged between adjacent quantum dot layers. The ligand group in the polymer alignment layer 23 is connected to the quantum dots in the quantum dot layer through a coordination bond. The third polymer alignment layer 23 may have main chains, at least parts of which have a same length direction in the third polymer alignment layer 23. At least parts of the main chains in the third polymer alignment layer 23 are in an ordered arrangement, it can enhance the tensile properties and bending properties of the film layer, and increase the stability of the film layer. The third polymer alignment layer 23 has a ligand group. The ligand groups are connected to the quantum dots in the quantum dot layer 30 through a coordination bond, so that the quantum dot layer can be kept stable.

Figure 3:
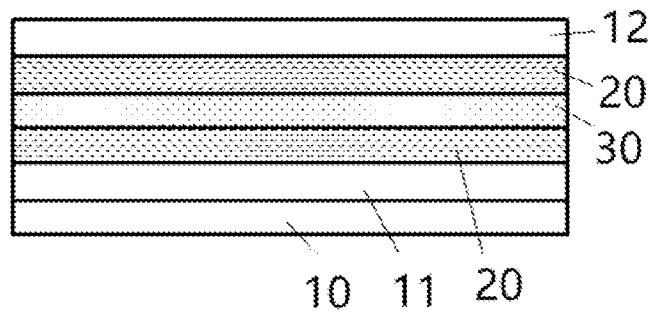
FIG. 3 is a schematic view showing a light emitting device according to one yet embodiment.
Figure 4:
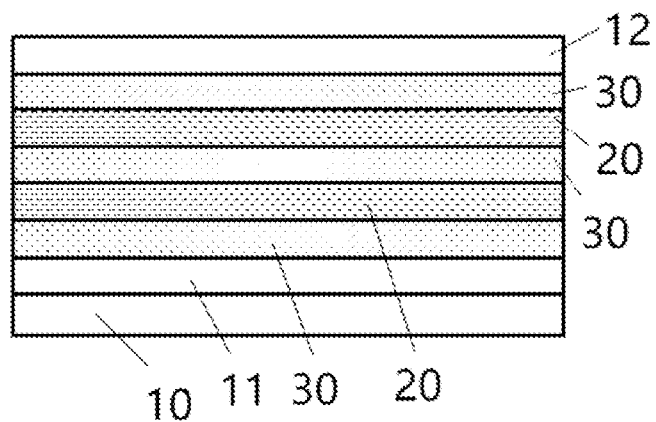
FIG. 4 is a schematic view showing a light emitting device according to one yet embodiment.

In some embodiments, as shown in FIG. 3, the polymer alignment layer 20 may have a plurality of layers, e.g., three layers, and the quantum dot layer 30 is arranged between adjacent polymer alignment layers 20. As shown in FIG. 4, when both the polymer alignment layer 20 and the quantum dot layer 30 have a plurality of layers, the polymer alignment layer 20 and the quantum dot layer 30 can be stacked alternately. The stacked arrangement of the polymer alignment layer 20 and the quantum dot layer 30 can keep the quantum dot layer stable, make the mechanical properties of the light emitting layer stable, and ensure the light emitting properties.

Figure 10:
FIG. 10 is one schematic view after the main chains are aligned in the polymer alignment layer.

In some embodiments, at least 70% of the main chains in the polymer alignment layer 20 have a same length direction. As shown in FIG. 10, the length direction of the main chains in the unaligned polymer alignment layer 20 is disordered, and the main chains have a same length direction in the aligned polymer alignment layer 20, and the alignment of the polymer alignment layer can be realized by pulsed laser irradiation. When at least 70% or more of the main chains in the polymer alignment layer 20 have the same length direction, that is, at least 70% or more of the main chains in the polymer alignment layer 20 are in a parallel state, the mechanical properties can be better improved and the polymerization, the polymer alignment layer 20 has better stretching and bending properties and better stability, and the mechanical properties of the light emitting layer are more stable.

Optionally, the polymer alignment layer 20 has a plurality of repeating units, a main chain in each of the repeating units may be connected to one ligand group. When the ligand group and the quantum dots are connected by a coordination bond, a certain distance can be created between the quantum dots, so as to avoid energy transfer between the quantum dots and to improve the light emitting performance. Each repeating unit can have a branched chain, and the number of chain length atoms of the branched chain is greater than or equal to 2 and less than or equal to 8. As for one polymer repeating unit, it can be formed by the polymerization of three monomers, and three monomer structures contain one coordinating chain.

In some embodiments, the main chains in the polymer alignment layer 20 may have a polar group, in which the polar group may include: at least one of hydroxyl, carboxyl, amino, amide, sulfonyl, sulfonic acid, sulfonamide, aliphatic amine, alicyclic amine, aromatic amine and nitrogen-containing groups of N-containing aromatic heterocycle, for example, the polar group may be hydroxyl or sulfonyl. The main chains in the polymer alignment layer 20 have a polar group to facilitate the alignment of the polymer alignment layer 20, and the polymer alignment layer 20 can realize alignment under the irradiation of the laser, so that the main chains have a same length direction in the polymer alignment layer 20 in an ordered state, and the polymer alignment layer 20 has better stretching and bending properties and improves stability.

In some embodiments, the polymer alignment layer 20 may include at least one of: a compound

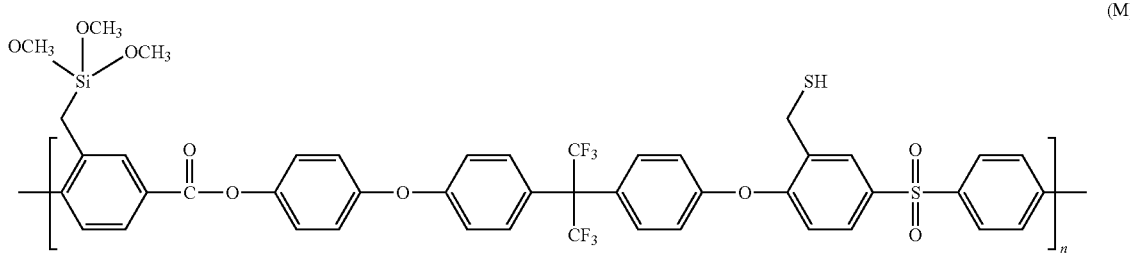

(M)

and a compound

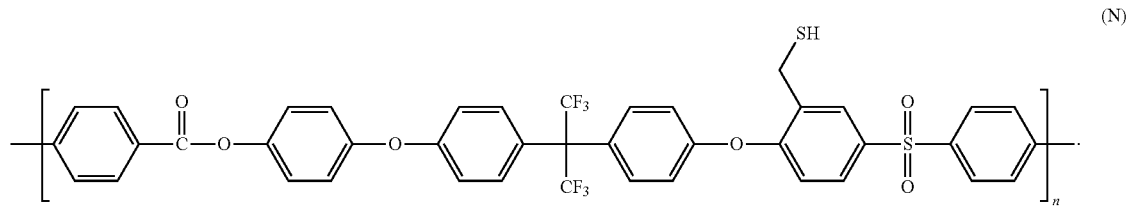

Optionally, the first polymer alignment layer 21 may be a film layer formed by the compound (M), the second polymer alignment layer 22 may be a film layer formed by the compound (M), and the third polymer alignment layer 23 may be a film layer formed of the compound (N), the sulfhydryl group in the compound (M) and the compound (N) can be connected to the quantum dots through a coordination bond, the film layer formed by the compound (M) and the compound (N) has better stretching and bending properties, the film layer formed by the compound (M) and the compound (N) have stable mechanical properties, which may be conducive to the stability of the polymer alignment layer, keep the quantum dot layer stable, and avoid the damage or cracks in the quantum dot layer during stretching and bending. The first polymer alignment layer 21 may include at least the compound (M), for example, the first polymer alignment layer 21 may only include the compound (M), and the trimethoxysilane in compound (M) can be chemically bonded to the hydroxyl on the adjacent film layers to enhance the connection strength. The second polymer alignment layer 22 may include at least the compound (M), for example, the second polymer alignment layer 22 may only include the compound (M), and the trimethoxysilane in the compound (M) can be chemically bonded to the hydroxyl on the adjacent film layers to enhance the connection strength. While the first polymer alignment layer 21 and the second polymer alignment layer 22 are aligned, the alignment layer 21 or the second polymer alignment layer 22 needs to be stacked with adjacent film layers (e.g., electrodes or carrier layers), and needs to enhance the connection strength. Therefore, the first polymer alignment layer 21 or the second polymer alignment layer 22 may include the compound (M) to enhance the connection strength of adjacent film layers. The polymer alignment layer 20 may include a third polymer alignment layer 23 arranged between adjacent quantum dot layers, the third polymer alignment layer 23 may realize alignment, and the third polymer alignment layer 23 may include the compound (N), for example, the third polymer alignment layer 23 may only include the compound (N), and the compound (N) may realize alignment.

In some embodiments, the polymer alignment layer 20 may include at least one of polyimide, polyethersulfone, polyphenylene ether and polyetheretherketone, which may be selected according to actual conditions. The mechanical properties of the polymer alignment layer 20 can be further improved by adding one or more of polyimide, polyethersulfone, polyphenylene ether, and polyetheretherketone.

An embodiment of the present disclosure provides a method for preparing a display substrate, including: forming a first electrode 11 on a base substrate 10; forming a light emitting layer on the first electrode 11; and forming a second electrode 12 on the light emitting layer, in which the light emitting layer includes a polymer alignment layer 20 and a quantum dot layer 30 arranged adjacently, the polymer alignment layer 20 having main chains, at least parts of which have a same length direction in the polymer alignment layer 30, and a ligand group connected to quantum dots in the quantum dot layer 30 through a coordination bond.

Optionally, the base substrate 10 may be a glass substrate. When both the polymer alignment layer 20 and the quantum dot layer 30 may have one layer, the polymer alignment layer 20 and the quantum dot layer 30 are stacked. When both the polymer alignment layers 20 and the quantum dot layers 30 have a plurality of layers, the polymer alignment layers 20 and the quantum dot layers 30 may be stacked alternately. The polymer alignment layer 20 may have main chains, at least parts of which have a same length direction in the polymer alignment layer 20. It should be noted that as long as the included angle in the length direction of the two main chains is within 10 degrees, it is deemed as the same length direction. At least part of the main chains in the polymer alignment layer 20 are in an ordered arrangement, it can enhance the tensile properties and bending properties of the film layer, and increase the stability of the film layer. The polymer alignment layer 20 has ligand groups, and the ligand groups are connected to the quantum dots in the quantum dot layer 30 through a coordination bond, so that the quantum dot layer can be kept stable. By arranging the polymer alignment layer 20 and the quantum dot layer 30 in the light emitting layer, the mechanical properties of the entire light emitting layer can be made more stable, the quantum dot layer can be prevented from being damaged or cracked during the stretching and bending process, and the stability of the light emitting performance can be ensured, to improve the performance of light emitting devices.

In some embodiments, the forming the light emitting layer on the first electrode 11 may include: coating a polymer material on the first electrode 11 and forming a polymer alignment layer 20 by irradiating the polymer material with light; and forming a quantum dot layer and another polymer alignment layer on the polymer alignment layer 20 in sequence; and the forming the quantum dot layer and another polymer alignment layer on the polymer alignment layer 20 in sequence may include: forming a quantum dot layer 30 on the polymer alignment layer 20; coating a polymer material on the quantum dot layer 30 and forming a polymer alignment layer 20 by irradiating the polymer material with light; and repeating the forming the quantum dot layer and another polymer alignment layer on the polymer alignment layer 20 in sequence one or more times.

When the forming the quantum dot layer and the polymer alignment layer on the polymer alignment layer 20 is performed only once, the structure of the light emitting layer may be a polymer alignment layer 20, a quantum dot layer 30 and a polymer alignment layer 20, which are stacked. When the forming the quantum dot layer and another polymer alignment layer on the polymer alignment layer 20 is performed twice, the light emitting layer may be a polymer alignment layer 20, a quantum dot layer 30, a polymer alignment layer 20, a quantum dot layer 30 and a polymer alignment layer 20, which are stacked. The number of times of repeating the above steps can be selected according to actual needs, so as to obtain light emitting layers with different layer structures.

In some embodiments, during the forming the quantum dot layer and the polymer alignment layer on the polymer alignment layer 20 in sequence, an initial ligand in the quantum dot layer 30 may be ligand-exchanged with the ligand group in the polymer alignment layer 20, such that the ligand groups in the polymer alignment layer 20 and the quantum dots in the quantum dot layer 30 are connected through a coordinate bond.

Figure 8:
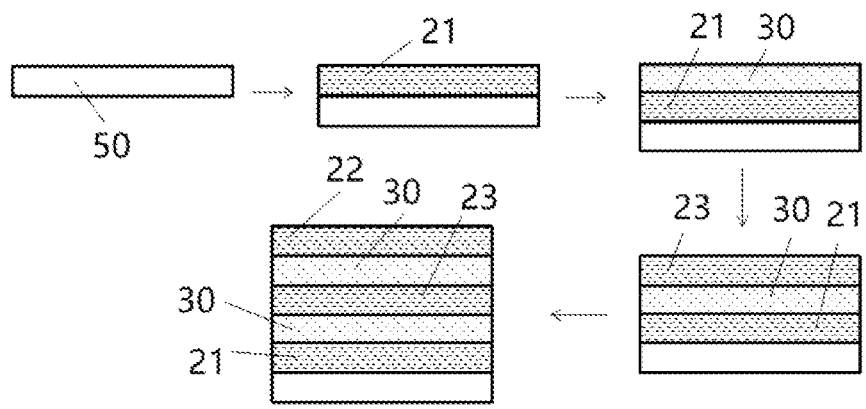
FIG. 8 is one schematic view showing a method for preparing a light emitting device.

In the preparation method, as shown in FIG. 8, the first polymer alignment layer 21 may be formed on the front film layer 50, the quantum dot layer 30 may be formed on the first polymer alignment layer 21, the initial ligand in the quantum dot layer 30 is ligand-exchanged with the ligand group in the first polymer alignment layer 21; the third polymer alignment layer 23 is formed on the quantum dot layer 30, and the initial ligand in the quantum dot layer 30 exchanged ligands with the ligand group in the third polymer alignment layer 23; the quantum dot layer 30 is formed on the third polymer alignment layer 23, and the initial ligand in the quantum dot layer 30 is ligand-exchanged with the ligand group in the third polymer alignment layer 23; and the second polymer alignment layer 22 is formed on the quantum dot layer 30, the initial ligand in the quantum dot layer 30 is ligand-exchanged with the ligand group in the second polymer alignment layer 22. Then, a corresponding electrode may be formed on the second polymer alignment layer 22, or a carrier transport layer and an electrode may be formed on the second polymer alignment layer 22. The front film layer 50 may include a hole transport layer or an electron transport layer, the front film layer 50 may be a base substrate 10 having the first electrode 11, and the front film layer 50 may be a film layer having a carrier transport layer arranged on the base substrate 10 having the first electrode 11, e.g., the first carrier transport layer 41.

Figure 9:
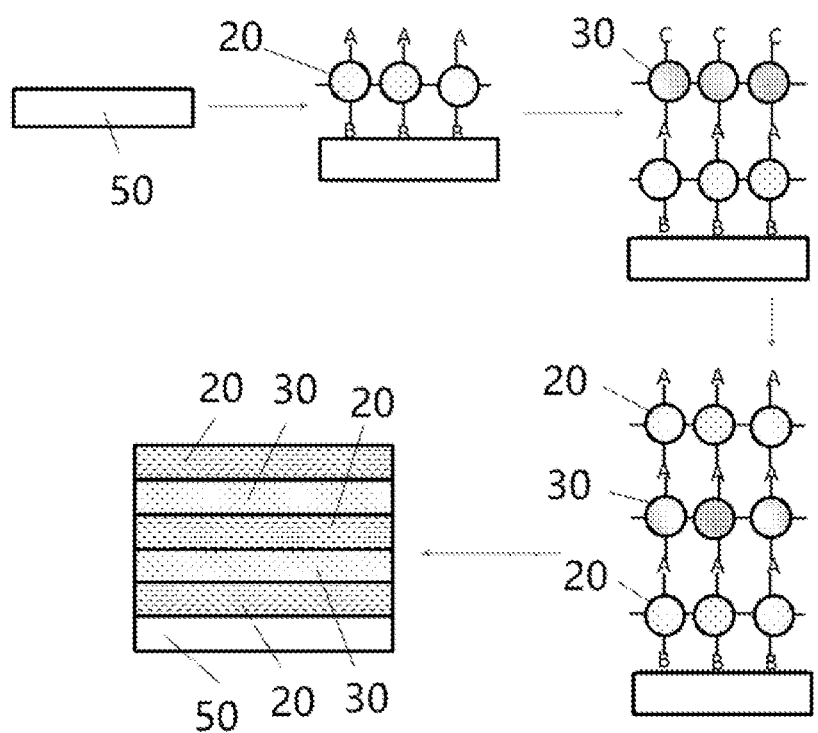
FIG. 9 is another schematic view showing a method for preparing a light emitting device.

As shown in FIG. 9, the polymer alignment layer 20 may be formed on the front film layer 50, the quantum dot layer 30 may be formed on the polymer alignment layer 20, and the initial ligand C in the quantum dot layer 30 is ligand-exchanged with the ligand group A in the polymer alignment layer 20; the polymer alignment layer 20 is formed on the quantum dot layer 30, and the initial ligand C in the quantum dot layer 30 is ligand-exchanged with the polymer alignment layer 20; a quantum dot layer 30 is formed on the polymer alignment layer 20, and the initial ligand C in the quantum dot layer is ligand-exchanged with the ligand group A in the polymer alignment layer 20; then, a polymer alignment layer 20 is formed on the quantum dot layer 30, and the initial ligand C in the quantum dot layer is ligand-exchanged with the ligand group A in the polymer alignment layer 20; and finally, a corresponding electrode can be formed on the polymer alignment layer 20, or a carrier transport layer and an electrode are formed on the polymer alignment layer 20.

During the preparation process, the polymer material may include one or both of the compound (M) and the compound (N), the first electrode 11 is coated with the polymer material, the polymer material is irradiated with light to form a polymer alignment layer 20, a quantum dot material layer is coated on the polymer alignment layer 20 to form a quantum dot layer 30, the quantum dot material layer may include quantum dots and initial ligands on the quantum dots, and ligand groups in the polymer material are ligand-exchanged with the initial ligand on the quantum dots, in which the initial ligand can be oleic acid; and the polymer material is re-coated on the quantum dot layer 30, the ligand groups in the polymer material are ligand-exchanged with the initial ligand on the quantum dots, and then the polymer material may be irradiated with light to form the polymer alignment layer 30. The initial ligands on the quantum dots may include, but are not limited to, carboxyl, amino, phosphoryl, etc. The initial ligands have a weaker coordination ability to the quantum dots than the ligand groups in the polymer alignment layer 20, and can be ligand-exchanged with the ligand groups.

In some embodiments, bottom-emitting QLED devices can be prepared as required, for example, inverted bottom-emitting QLED devices, in which the quantum dot material is cadmium selenide/zinc sulfide core-shell structure, the initial ligand is oleic acid, and the concentration is 20 mg/ml, the solvent is octane.

The method for preparing the light emitting device may include the steps of:

spin-coating zinc oxide nanoparticles by sol-gel method on the ITO substrate in air (spin coating speed is 2000 rpm, time is 30 s, concentration is 75 mg/ml), followed by annealing at 180 degrees Celsius for 1 minute;

immersing the substrate in N,N-dimethylformamide solution (5 mg/ml) of the polymer material (M) for about 10 minutes, followed by rinsing with N,N-dimethylformamide after pulling to form a polymer material layer, then irradiating the film with a polarized pulsed light wave with a wavelength of 266 nm, in which the power is 30 mw, the laser pulse frequency is 10 Hz and the interval is 5 ns, and then spin-coating the octane solution of the quantum dots, standing for 1 min to allow quantum dots to be ligand-exchanged with the polymer material of the lower film layer, and washing the surface of the quantum dots with octane to form a single-layer quantum dot layer;

then immersing the substrate in the N,N-dimethylformamide solution (5 mg/ml) of the polymer material (N) for about 10 minutes, to form a polymer material layer after rinsing, which is ligand-exchanged with the upper surface of the quantum dot layer, and then irradiating the polymer material layer with a polarized pulsed light wave, in which the wavelength is 266 nm, the power is 30 mw, the laser pulse frequency is 10 Hz and the interval is 5 ns;

then spin-coating the octane solution of the quantum dots, standing for 1 min after completion to allow the quantum dots to be ligand-exchanged with the polymer material of the lower film layer, and rinsing the surface of the quantum dots with octane after completion to form a single-layer quantum dot layer;

then immersing the substrate in the N,N-dimethylformamide solution (5 mg/ml) of the polymer material (N) for about 10 minutes, to form the polymer material layer after rinsing, which is ligand-exchanged with the upper surface of the quantum dot layer, and then irradiating the film with a polarized pulsed light wave, in which the wavelength is 266 nm, the power was 30 mw, the laser pulse frequency is 10 Hz and the interval is 5 ns;

forming the final light emitting layer into the structure of polymer alignment layer/quantum dot layer/polymer alignment layer/quantum dot layer/polymer alignment layer, and followed by annealing in a glove box at 120 degrees Celsius for 10 minutes;

then preparing a hole transport layer and a hole injection layer by evaporation, and evaporating a silver electrode to a thickness of 120 nm, and completing the preparation of the light emitting device after packaging.

In other embodiments, a bottom-emitting QLED device can be prepared as required, for example, a positive bottom-emitting QLED device, the quantum dot material can be a cadmium selenide/zinc sulfide core-shell structure, in which the initial ligand is oleic acid, and the concentration is 20 mg/ml, the solvent is octane.

The method for preparing the light emitting device may include the steps of:
spin-coating nickel oxide nanoparticles in air on the ITO substrate (spin coating speed is 2000 rpm, time 30 s, concentration is 25 mg/ml), followed by annealing at 120 degrees Celsius for 2 minutes;
immersing the substrate in N,N-dimethylformamide solution (5 mg/ml) of the polymer material (M) for about 10 minutes, followed by rinsing with N,N-dimethylformamide after pulling to form a polymer material layer, then irradiating the film with a polarized pulsed light wave with a wavelength of 266 nm, in which the power is 30 mw, the laser pulse frequency is 10 Hz and the interval is 5 ns, and then spin-coating the octane solution of the quantum dots, standing for 1 min to allow quantum dots to be ligand-exchanged with the polymer material (M) of the lower film layer, and washing the surface of the quantum dots with octane to form a single-layer quantum dot layer;
then immersing the substrate in the N,N-dimethylformamide solution (5 mg/ml) of the polymer material (N) for about 10 minutes, to form the polymer material layer after rinsing, which is ligand-exchanged with the upper surface of the quantum dot layer, and then irradiating the film with a polarized pulsed light wave, in which the wavelength is 266 nm, the power was 30 mw, the laser pulse frequency is 10 Hz and the interval is 5 ns;
then spin-coating the octane solution of the quantum dots, standing for 1 min after completion to allow the quantum dots to be ligand-exchanged with the polymer material (N) of the lower film layer, and rinsing the surface of the quantum dots with octane after completion to form a single-layer quantum dot layer;
then immersing the substrate in the N,N-dimethylformamide solution (5 mg/ml) of the polymer material (N) for about 10 minutes, to form the polymer material layer after rinsing, which is ligand-exchanged with the upper surface of the quantum dot layer, and then irradiating the film with a polarized pulsed light wave, in which the wavelength is 266 nm, the power was 30 mw, the laser pulse frequency is 10 Hz and the interval is 5 ns;
forming the final light emitting layer into the structure of polymer alignment layer/quantum dot layer/polymer alignment layer/quantum dot layer/polymer alignment layer, and followed by annealing in a glove box at 120 degrees Celsius for 10 minutes;
then continuing to spin-coat zinc oxide nanoparticles (spin-coating speed is 3000 rpm, time is 30 s, concentration is 30 mg/ml), followed by annealing at 120 degrees Celsius for 20 minutes; vapor-depositing aluminum electrodes with a thickness of 120 nm, and completing the preparation of the device after encapsulation.

In some embodiments, a bottom-emitting QLED device can be prepared as required, for example, a positive top-emitting QLED device, the quantum dot material can be a cadmium selenide/zinc sulfide core-shell structure, in which the initial ligand is oleic acid, the concentration is 20 mg/ml, and the solvent is octane.

The method for preparing the light emitting device may include the steps of:
spin-coating nickel oxide nanoparticles in air on the ITO substrate (spin coating speed is 2000 rpm, time is 30 s, concentration is 25 mg/ml), followed by annealing at 120 degrees Celsius for 2 minutes;
immersing the substrate in N,N-dimethylformamide solution (5 mg/ml) of the polymer material (M) for about 10 minutes, followed by rinsing with N,N-dimethylformamide after pulling to form a polymer material layer, then irradiating the film with a polarized pulsed light wave with a wavelength of 266 nm, in which the power is 30 mw, the laser pulse frequency is 10 Hz and the interval is 5 ns, and then spin-coating the octane solution of the quantum dots, standing for 1 min to allow quantum dots to be ligand-exchanged with the polymer material (M) of the lower film layer, and washing the surface of the quantum dots with octane to form a single-layer quantum dot layer;
then immersing the substrate in the N,N-dimethylformamide solution (5 mg/ml) of the polymer material (N) for about 10 minutes, to form the polymer material layer after rinsing, which is ligand-exchanged with the upper surface of the quantum dot layer, and then irradiating the film with a polarized pulsed light wave, in which the wavelength is 266 nm, the power was 30 mw, the laser pulse frequency is 10 Hz and the interval is 5 ns;
then spin-coating the octane solution of the quantum dots, standing for 1 min after completion to allow the quantum dots to be ligand-exchanged with the polymer material (N) of the lower film layer, and rinsing the surface of the quantum dots with octane after completion to form a single-layer quantum dot layer;
then immersing the substrate in the N,N-dimethylformamide solution (5 mg/ml) of the polymer material (N) for about 10 minutes, to form the polymer material layer after rinsing, which is ligand-exchanged with the upper surface of the quantum dot layer, and then irradiating the film with a polarized pulsed light wave, in which the wavelength is 266 nm, the power was 30 mw, the laser pulse frequency is 10 Hz and the interval is 5 ns;
forming the final light emitting layer into the structure of polymer alignment layer/quantum dot layer/polymer alignment layer/quantum dot layer/polymer alignment layer, and followed by annealing in a glove box at 120 degrees Celsius for 10 minutes;
then continuing to spin-coat zinc oxide nanoparticles (spin-coating speed is 3000 rpm, time is 30 s, concentration is 30 mg/ml), followed by annealing at 120 degrees Celsius for 20 minutes; sputtering an indium gallium zinc oxide (IGZO) electrode with a thickness of 50 nm, and completing the preparation of the device after packaging.

An embodiment of the present disclosure provides a display panel including the light emitting device described in the above embodiments. In the display panel with the light emitting device described in the above embodiments, the light emitting layer in the light emitting device has better mechanical properties and better light emitting effect, thereby improving the display effect of the display panel.

An embodiment of the present disclosure provides a display device including the display substrate described in the above embodiments. The display device having the display panel described in the above embodiments can improve the display effect and has good stability.

The above are merely part of the embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A light emitting device, comprising:
   a base substrate; and
   a first electrode, a light emitting layer and a second electrode stacked on the base substrate in sequence,
   wherein the light emitting layer comprises a polymer alignment layer and a quantum dot layer arranged adjacently, and the polymer alignment layer has main chains, at least parts of which have a same length direction in the polymer alignment layer, and a ligand group connected to quantum dots in the quantum dot layer through a coordination bond,
   wherein the polymer alignment layer comprises at least one of:

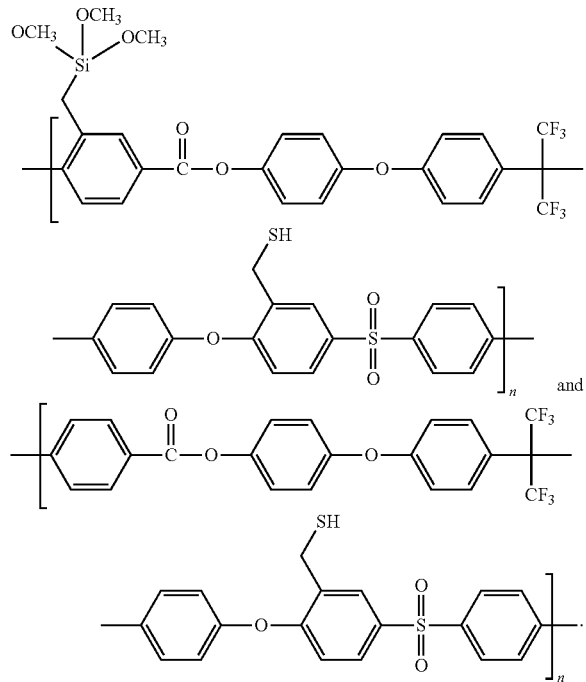

2. The light emitting device of claim 1, wherein the quantum dot layer has a plurality of layers, and the polymer alignment layer comprises the polymer alignment layer arranged between adjacent quantum dot layers.

3. The light emitting device of claim 1, wherein the polymer alignment layer has a plurality of layers, and the quantum dot layer is arranged between adjacent polymer alignment layers.

4. The light emitting device of claim 1, wherein at least 70% of the main chains in the polymer alignment layer have a same length direction.

5. The light emitting device of claim 1, wherein the polymer alignment layer has a plurality of repeating units, and the main chain in each of the repeating units is connected to one ligand group.

6. The light emitting device of claim 1, wherein the polymer alignment layer comprises at least one selected from a group consisting of polyimide, polyethersulfone, polyphenylene ether and polyetheretherketone.

7. A display panel, comprising the light emitting device of claim 1.

8. A display device, comprising the display panel of claim 7.

9. The display device of claim 8, wherein the quantum dot layer has a plurality of layers, and the polymer alignment layer comprises the polymer alignment layer arranged between adjacent quantum dot layers.

10. The display device of claim 8, wherein the polymer alignment layer has a plurality of layers, and the quantum dot layer is arranged between adjacent polymer alignment layers.

11. The display device of claim 8, wherein at least 70% of the main chains in the polymer alignment layer have a same length direction.

12. The display device of claim 8, wherein the polymer alignment layer has a plurality of repeating units, and the main chain in each of the repeating units is connected to one ligand group.

13. The display panel of claim 7, wherein the quantum dot layer has a plurality of layers, and the polymer alignment layer comprises the polymer alignment layer arranged between adjacent quantum dot layers.

14. The display panel of claim 7, wherein the polymer alignment layer has a plurality of layers, and the quantum dot layer is arranged between adjacent polymer alignment layers.

15. The display panel of claim 7, wherein at least 70% of the main chains in the polymer alignment layer have a same length direction.

16. The display panel of claim 7, wherein the polymer alignment layer has a plurality of repeating units, and the main chain in each of the repeating units is connected to one ligand group.

17. The display panel of claim 7, wherein the polymer alignment layer comprises at least one selected from a group consisting of polyimide, polyethersulfone, polyphenylene ether and polyetheretherketone.

18. A method for preparing a light emitting device, comprising:
   forming a first electrode on a base substrate;
   forming a light emitting layer on the first electrode; and
   forming a second electrode on the light emitting layer,
   wherein the light emitting layer comprises a polymer alignment layer and a quantum dot layer arranged adjacently, the polymer alignment layer has main chains, at least parts of which have a same length direction in the polymer alignment layer, and a ligand group connected to quantum dots in the quantum dot layer through a coordination bond,
   wherein the polymer alignment layer comprises at least one of:

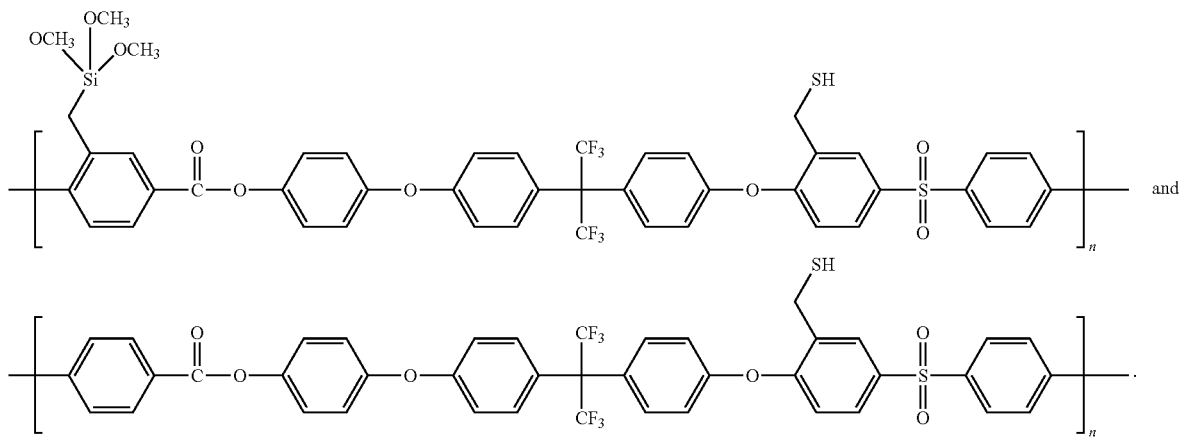

19. The method of claim 18, wherein the forming the light emitting layer on the first electrode comprises:

coating a polymer material on the first electrode, and forming the polymer alignment layer by irradiating the polymer material with light; and forming the quantum dot layer and another polymer alignment layer on the polymer alignment layer in sequence, the forming the quantum dot layer and another polymer alignment layer on the polymer alignment layer in sequence comprises:

forming the quantum dot layer on the polymer alignment layer;

coating the polymer material on the quantum dot layer, and forming another polymer alignment layer by irradiating the polymer material with light; and repeating the forming the quantum dot layer and another polymer alignment layer on the polymer alignment layer in sequence one or more times.

20. The method of claim 19, wherein during the forming the quantum dot layer and another polymer alignment layer on the polymer alignment layer in sequence, an initial ligand in the quantum dot layer is ligand-exchanged with the ligand group in the polymer alignment layer, such that the ligand groups in the polymer alignment layer and the quantum dots in the quantum dot layer are connected through a coordinate bond.

* * * * *